United States Patent
Bradl et al.

[19]

[11] Patent Number: 6,014,218
[45] Date of Patent: Jan. 11, 2000

[54] DEVICE AND METHOD FOR END-POINT MONITORING USED IN THE POLISHING OF COMPONENTS, IN PARTICULAR SEMICONDUCTOR COMPONENTS

[75] Inventors: Stephan Bradl, Köfering; Olaf Heitzsch, Coswig, both of Germany

[73] Assignee: Siemens Aktiengesellschaft, Munich, Germany

[21] Appl. No.: 09/204,785

[22] Filed: Dec. 3, 1998

[30] Foreign Application Priority Data

Dec. 3, 1997 [DE] Germany ................... 197 53 691

[51] Int. Cl.[7] ................ G01B 11/06; G01B 11/30
[52] U.S. Cl. ........................... 356/381; 356/371
[58] Field of Search ..................... 356/213, 381, 356/382, 371, 432; 451/6, 287

[56] References Cited

U.S. PATENT DOCUMENTS

| | | | |
|---|---|---|---|
| 4,733,080 | 3/1988 | Brunnschweiler et al. | 250/341 |
| 5,081,796 | 1/1992 | Schultz | 51/165.74 |
| 5,433,651 | 7/1995 | Lustig et al. | |
| 5,838,447 | 11/1998 | Hiyama et al. | 356/381 |
| 5,893,796 | 4/1999 | Birang et al. | 451/526 |

*Primary Examiner*—Frank G. Font
*Assistant Examiner*—Lay la G. Lauchman
*Attorney, Agent, or Firm*—Herbert L. Lerner; Laurence A. Greenberg

[57] ABSTRACT

A device for end-point monitoring used in the polishing of components, in particular semiconductor components. The device has a textile structure, which may be constructed as a cloth or a pad, and is used to accommodate a component that is to be monitored. The textile-like structure has a windowless construction. The textile structure may be disposed on a platen. Furthermore, a light source, preferably a laser, for emitting a monochromatic red light beam having a preferred wavelength of approximately 800 nm is provided. The red light beam is directed through the textile structure onto the component to be monitored. In addition, a detector is used to detect the red light beam reflected by the component to be monitored. The end-point monitoring may, for example, be carried out by interferometry. In addition, a corresponding method is also described.

22 Claims, 1 Drawing Sheet

DEVICE AND METHOD FOR END-POINT MONITORING USED IN THE POLISHING OF COMPONENTS, IN PARTICULAR SEMICONDUCTOR COMPONENTS

BACKGROUND OF THE INVENTION

Field of the Invention

The present invention relates to a device and method for end-point monitoring used in the polishing of components, in particular semiconductor components.

The determination and monitoring of layer thicknesses is an indispensable aid for process control and process monitoring in the production of semiconductor components. Thus it is possible, for example in chemical/mechanical polishing (CMP), to measure the layer thicknesses of components, for example of wafers, on-line during processing.

Such layer thickness determinations may be carried out using ellipsometers or by interferometry.

In the context of interferometry, laser interferometry, for example, may be used. In order to determine the layer thickness, the wafer is scanned through the polishing pad or polishing cloth used in the CMP process. The polishing pads or cloths are constructed in such a way as to transmit light. Normally, pads or cloths which include a plurality of layers are used, in which pads or cloths a window which is transparent to the light wavelengths is adhesively bonded. Such a pad or cloth is illustrated in FIG. 1 and is explained in more detail in the description of the figures. The production of the pads and cloths entails correspondingly high costs and, moreover, with increasing abrasion of the pad or cloth may lead to a high level of defects. Consequently, the pads or cloths have to be exchanged frequently, with the result that the method for end-point monitoring is relatively time and cost intensive.

SUMMARY OF THE INVENTION

It is accordingly an object of the invention to provide a device and a method for end-point monitoring used in the polishing of components which overcome the above-mentioned disadvantages of the prior art devices and methods of this general type, which allows the end-point monitoring to take place inexpensively, reliably and without any great time delays during the process.

With the foregoing and other objects in view there is provided, in accordance with the invention, a device for end-point monitoring used in polishing components, including: a windowless textile structure for accommodating a component to be monitored; a light source emitting a red light beam directed through the textile structure onto the component to be monitored; and a detector for detecting the red light beam reflected by the component.

In accordance with an added feature of the invention, the textile structure is a cloth or a pad.

In accordance with another feature of the invention, the component is a semiconductor component.

In the present invention, it was observed that commercially available textile-like structures which do not have any windows whatsoever are able to transmit red light without the light being fully absorbed by the textile structure. Such textile-like structures are, for example, woven fabrics, cloths or pads that are used in the production of semiconductor components, for example as polishing materials in the CMP process. However, the invention is not limited to these type of components and textile structures. The light source used may be any light source that generates a red, monochromatic light.

According to the invention, the textile-like structures may now have a windowless construction. Therefore, it is possible to dispense with the textile structures with incorporated windows that have hitherto been conventional and are known from the prior art. As a result, it is possible to considerably reduce costs. Furthermore, there is no risk of the incidence of defects on the surfaces of the components increasing due to the wear of the textile structures. This risk results from the fact that the windows are made from a different, harder material in comparison with the rest of the textile structure, so that contact of the often sensitive surfaces of the components with the window material may lead to damage, such as scratches or the like. The possibility of using textile structures with a windowless construction (i.e. textile structures without incorporated windows) therefore increases the service life of the textile structures, so that the idle times in the method and the costs can be further reduced. Furthermore, instability in the process and a limited applicability of the textile structures resulting from different materials in the textile structures can be avoided. It is also possible to prevent different properties of the textile structure in the region of the window material and in the region of the rest of the structure, such as for example different compressibility, hardness or absorbency with respect to slurry and water.

Consequently, it is possible, using the device according to the invention, to use commercially available textile structures without windows in the end-point monitoring of wafers and other components which is customarily carried out simultaneously during the production process. The invention is not limited to the end-point monitoring used in the polishing of specific components, but may preferably be used in the production of semiconductor components, such as for example storage elements, logic elements, micromechanical components or optical components. During the production process, the components may be present in the form of wafers, in which case the layers which are to be monitored may be formed by applying materials to the wafer surface or by removing regions of the wafer surfaces, for example by etching or the like. However, the invention is not limited to any specific way of forming the layer that is to be monitored.

In a preferred configuration, the light source may be a laser. This makes it possible to provide an optimally oriented, directed and intensive red light beam.

According to the invention, the red light beam emitted from the light source may have a wavelength of greater than 650 nm, and preferably of approximately 800 nm.

In a further configuration, the intensity of the light source and/or the sensitivity of the detector can be adjusted. As a result, the device can be set individually, depending on requirements and prevailing process conditions, in the end-point monitoring used in the polishing of the components.

Preferably, the light source and the detector may be integrated in a single unit. This reduces the manufacturing cost of the device.

The textile-like structure is preferably disposed on a platen. The platen is used for the planar support of the textile-like structure and the component, for example a wafer, which is situated on the structure.

According to the invention, the light source and/or the detector may be disposed inside the platen. As a result, it is possible for the device to be of simple construction. Furthermore, the light source and the detector are protected from contamination and damage that could falsify measurement results. In order to ensure that the path of the red light beam is not impeded, the platen is preferably transparent, at least in the region of the light source and of the detector.

According to a further aspect of the present invention, a method for end-point monitoring which is used in the polishing of components, in particular semiconductor components, is provided, which method can preferably be carried out using the device as described above. According to the invention, the method is characterized by the following steps: a) placing the component to be monitored on a textile-like structure, preferably a cloth or pad, the textile-like structure having a windowless construction; b) emitting a red light beam from a light source, the red light beam being directed through the textile structure onto the component which is to be monitored; c) detecting the red light beam reflected by the component which is to be monitored in a detector; and d) carrying out the end-point monitoring on the basis of the values of the wave trains for the red light beam emitted by the light source and detected by the detector.

The method according to the invention allows simple and inexpensive end-point monitoring which is used in the polishing of components, while simultaneously preventing damage to the components, for example as a result of the wear to the textile structure. The end-point monitoring can be used, for example, to determine the thickness of individual layers on the components. With regard to the advantages, effects, consequences and functions of the individual steps and features of the method, reference is made to all the above statements relating to the device according to the invention.

According to the invention, the calculation mentioned under step d) can be carried out by interferometry.

In a further configuration, the light source may be a laser. The red light beam is advantageously emitted by the light source at a wavelength of greater than 650 nm, and preferably of approximately 800 nm. According to the invention, the intensity of the light source and/or the sensitivity of the detector may be adjusted.

According to a third aspect of the present invention, the device described above and/or the method described above can be employed for end-point monitoring which is used in the polishing of components, in particular semiconductor components, in particular in the chemical/mechanical polishing (CMP) process. In the polishing process, certain materials are abraded over pre-structured surfaces by abrasive-containing polishing agents. The materials are abraded and removed with the aid of a polishing pad or a polishing cloth. The device and method according to the invention make it possible to use commercially available polishing pads or polishing cloths. It is therefore possible to dispense with the use of polishing pads or polishing cloths which have windows, and therefore to avoid the resultant drawbacks which are mentioned above.

According to a further aspect of the present invention, it is possible to employ a textile-like structure, preferably a cloth or a pad, which is of windowless construction, in a device described above and/or in a method described above for end-point monitoring used in the polishing of components, in particular semiconductor components, in particular in the CMP process.

Other features which are considered as characteristic for the invention are set forth in the appended claims.

Although the invention is illustrated and described herein as embodied in a device and a method for end-point monitoring used in the polishing of components, in particular semiconductor components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
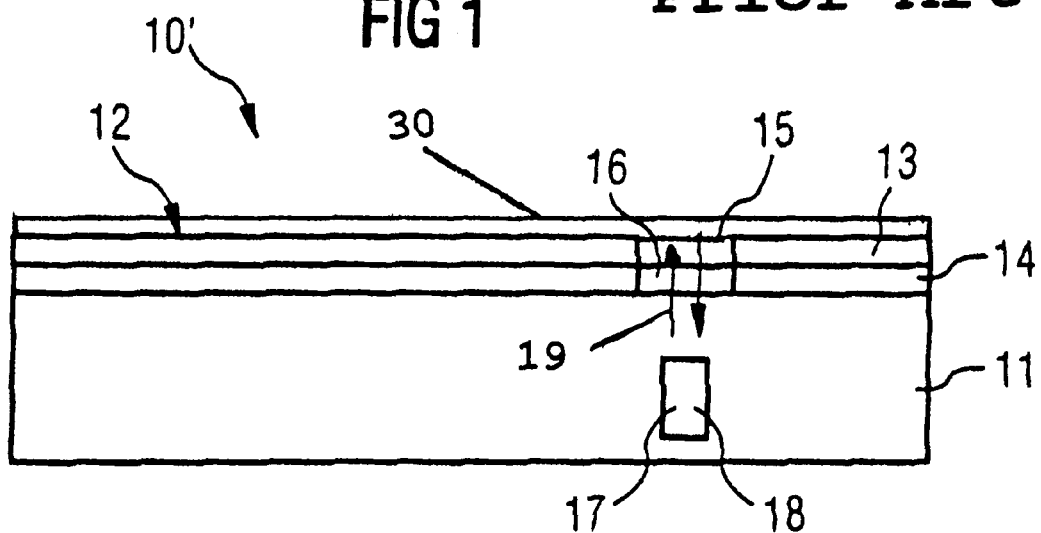
FIG. 1 is a diagrammatic, cross-sectional view of a prior art device for end-point monitoring used in the polishing of components.

In all the figures of the drawing, sub-features and integral parts that correspond to one another bear the same reference symbol in each case. Referring now to the figures of the drawing in detail and first, particularly, to FIG. 1 thereof, there is shown a device 10', which is known from the prior art, for end-point monitoring which is used in the polishing of components, in particular semiconductor components. The device 10' operates using the principle of laser interference, using a laser 17. The device 10' has a platen 11 on which a textile structure 12 is disposed. The textile structure 12 is a polishing cloth, as is used in the processing of wafers in chemical/mechanical polishing (CMP). The polishing cloth 12 includes an upper polishing-cloth layer 13 and a lower polishing-cloth layer 14. Both polishing-cloth layers 13, 14 have a window opening 15. A transparent window 16 is fitted into the window opening 15 in the lower polishing-cloth layer 14. The window 16 has the function of allowing through the monochromatic light beam 19 that is emitted by a laser 17. The laser 17 is disposed in the platen 11. The light beam 19 passes through the window 16 and the window opening 15 and is incident on the surface of the component on which the end-point monitoring is to be carried out. A component 30 is disposed on the upper polishing-cloth layer 13. The laser beam 19 is reflected by the surface of the component and is detected by a detector 18, which is also disposed in the platen 11. Both the laser 17 and the detector 18 are configured in a single unit. The end-point monitoring, for example a layer thickness determination, on the component can be carried out on the basis of the interference between the two wave trains of the laser beam 19 which is emitted by the laser 17 and the laser beam 19 which is reflected from the component and is detected in the detector 18.

A first drawback of the polishing cloth 12 in accordance with FIG. 1 is that it is relatively complicated, and therefore expensive, to produce. Furthermore, the polishing cloth 12 has to be positioned accurately in relation to the laser 17 and to the detector 18, in order to avoid falsification of the measurement results. In particular, it is necessary to ensure that the window opening 15 is always located accurately above the laser 17 and the detector 18 in order to ensure that the laser beam 19 is able to propagate without hindrance.

Since the window material consists of a harder material than the upper layer 13, which is provided for machining of the component, of the polishing cloth 12, in the event of abrasion to the upper layer 13 the sensitive surface of the component may be damaged by the harder layer 14, 16, for example in the form of scratches or the like. Furthermore, the material which is used for the lower polishing-cloth layer 14 and the window 16 may lead to the possible applications of the polishing cloth 12 being limited if the material is not compatible with all process conditions and features and the materials of the components.

The above-mentioned drawbacks can be avoided with the device 10 according to the invention for end-point monitoring which is used in the polishing of components. The device 10 is illustrated in FIG. 2.

Figure 2:
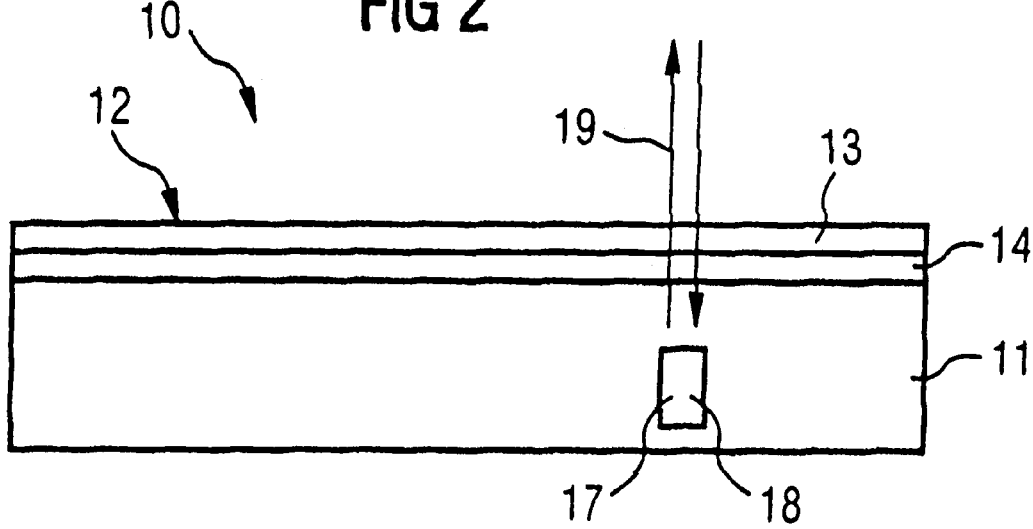
FIG. 2 is a cross-sectional view of a device for end-point monitoring used in the polishing of components according to the invention.

The device 10 in accordance with FIG. 2 has the platen 11 on which the polishing cloth 12 is disposed. The polishing cloth has the upper polishing-cloth layer 13 and the lower polishing-cloth layer 14. However, the polishing cloth 12 may also be of single-layer construction. In contrast to the polishing cloth from FIG. 1, the polishing cloth 12 in accordance with FIG. 2 is windowless. A component, the layer thickness of which is to be determined, is disposed on the polishing cloth 12. The laser 17 and the detector 18 that are combined in a single unit are disposed in the platen 11. The light emanating from the laser is a directed, monochromatic red light beam 19 with a wavelength of about 800 nm.

The way in which the device operates will be described below. The component, which may, for example, be a wafer and on which the end-point monitoring is to be carried out, is situated on the upper polishing-cloth layer 13. The red light beam 19 is emitted from the laser 17 and penetrates through the polishing cloth 12 without the light being completely absorbed by the polishing cloth 12. The red light beam 19 is incident on the surface of the component that is to be monitored and is reflected from this surface. The reflected red light beam 19 is detected by the detector 18. Using the intensity of the two beams, the end-point monitoring can be carried out by interferometry. Since the red light beam 19 is able to penetrate through the polishing cloth 12, conventional polishing cloths without windows can be used in the device 10.

We claim:

1. A device for end-point monitoring used in polishing components, comprising:
    a windowless textile structure for accommodating a component to be monitored;
    a light source emitting a red light beam directed through said textile structure onto the component to be monitored; and
    a detector for detecting said red light beam reflected by the component.

2. The device according to claim 1, wherein said textile structure is one of a cloth and a pad.

3. The device according to claim 1, wherein the component is a semiconductor component.

4. The device according to claim 1, wherein said light source is a laser.

5. The device according to claim 1, wherein said red light beam emitted by said light source has a wavelength of greater than 650 nm.

6. The device according to claim 1, wherein said red light beam emitted by said light source has a wavelength of about 800 nm.

7. The device according to claim 1, wherein said light source has an adjustable intensity and said detector has an adjustable sensitivity.

8. The device according to claim 1, wherein said light source and said detector are an integrated, single unit.

9. The device according to claim 1, including a platen for receiving and supporting said textile structure.

10. The device according to claim 9, wherein at least one of said light source and said detector is disposed in said platen.

11. A method for end-point monitoring used in polishing components, which comprises:
    a) placing a component to be monitored on a windowless textile structure;
    b) emitting a red light beam from a light source through the textile structure onto the component to be monitored;
    c) detecting the red light beam reflected by the component to be monitored with a detector; and
    d) carrying out the end-point monitoring on a basis of values of wave trains of the red light beam emitted by the light source and detected by the detector.

12. The method according to claim 11, which comprises using a semiconductor component as the component.

13. The method according to claim 11, which comprises using one of a cloth and a pad as the textile structure.

14. The method according to claim 11, which comprises calculating a layer thickness of the component by interferometry during step d).

15. The method according to claim 11, which comprises using a laser as the light source.

16. The method according to claim 11, which comprises emitting the red light beam from the light source at a wavelength of greater than 650 nm.

17. The method according to claim 11, which comprises emitting the red light beam from the light source at a wavelength of approximately 800 nm.

18. The method according to claim 11, which comprises providing the light source with an adjustable intensity.

19. The method according to claim 11, which comprises providing the detector with an adjustable sensitivity.

20. The method according to claim 11, which comprises polishing the component.

21. The method according to claim 11, which comprises chemically/mechanically polishing the component.

22. A method for polishing components, which comprises:
    chemically/mechanically polishing a component; and
    monitoring the component with the device according to claim 1.

* * * * *